(12) United States Patent
Marzaki et al.

(10) Patent No.: US 12,356,725 B2
(45) Date of Patent: Jul. 8, 2025

(54) INTEGRATED CIRCUIT INCLUDING STANDARD CELLS AND AT LEAST ONE CAPACITIVE FILLING STRUCTURE

(71) Applicant: STMicroelectronics (Rousset) SAS, Rousset (FR)

(72) Inventors: Abderrezak Marzaki, Aix en Provence (FR); Jean-Marc Voisin, Chateauneuf-le-Rouge (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 490 days.

(21) Appl. No.: 17/944,793

(22) Filed: Sep. 14, 2022

(65) Prior Publication Data

US 2023/0088967 A1    Mar. 23, 2023

(30) Foreign Application Priority Data

Sep. 17, 2021  (FR) ...................................... 2109789

(51) Int. Cl.
*H10D 89/10* (2025.01)
*H01L 21/768* (2006.01)
*H01L 23/64* (2006.01)

(52) U.S. Cl.
CPC ....... *H10D 89/10* (2025.01); *H01L 21/76831* (2013.01); *H01L 21/76877* (2013.01); *H01L 23/642* (2013.01)

(58) Field of Classification Search
CPC .............. H10D 89/10; H01L 21/76831; H01L 21/76877; H01L 23/642
See application file for complete search history.

(56) References Cited

U.S. PATENT DOCUMENTS

| | | | | |
|---|---|---|---|---|
| 7,329,938 B2* | 2/2008 | Kinoshita | .............. | H10D 89/10 |
| | | | | 257/512 |
| 8,344,391 B2* | 1/2013 | Fornara | .................. | H10B 69/00 |
| | | | | 438/467 |
| 8,592,288 B2* | 11/2013 | Fornara | .................. | G11C 17/16 |
| | | | | 438/467 |

(Continued)

FOREIGN PATENT DOCUMENTS

| | | | | |
|---|---|---|---|---|
| CN | 114975422 A | * | 8/2022 | ........... G06F 30/392 |
| CN | 115831875 A | * | 3/2023 | ....... H01L 21/76831 |

(Continued)

OTHER PUBLICATIONS

INPI Search Report and Written Opinion for priority application, FR 2109789, report dated May 27, 2022, 10 pgs.

*Primary Examiner* — Laura M Menz
(74) *Attorney, Agent, or Firm* — Crowe & Dunlevy LLC

(57) ABSTRACT

The integrated circuit includes a logic part including standard cells arranged in parallel rows along a first direction and in an alternation of complementary semiconductor wells. Among the standard cells, at least one capacitive filling structure belongs to two adjacent rows and includes a capacitive interface between a conductive armature and the first well, the extent of the second well in the first direction being interrupted over the length of the capacitive filling structure so that the first well occupies in the second direction the width of the two adjacent rows of the capacitive filling structure. A conductive structure electrically connects the second well on either side of the capacitive filling structure.

20 Claims, 10 Drawing Sheets

(56) References Cited

U.S. PATENT DOCUMENTS

| | | | | |
|---|---|---|---|---|
| 8,969,967 | B2* | 3/2015 | Noel | H10D 84/038 |
| | | | | 257/351 |
| 10,818,669 | B2* | 10/2020 | Marzaki | H10B 12/0387 |
| 10,879,233 | B2* | 12/2020 | Marzaki | H10D 30/63 |
| 11,004,785 | B2* | 5/2021 | Marzaki | H10D 1/692 |
| 11,081,488 | B2* | 8/2021 | Marzaki | H10B 12/0385 |
| 11,139,303 | B2* | 10/2021 | Marzaki | H10B 12/395 |
| 11,250,930 | B2* | 2/2022 | Denorme | G11C 17/123 |
| 11,621,051 | B2* | 4/2023 | Denorme | G11C 17/123 |
| | | | | 365/174 |
| 11,626,365 | B2* | 4/2023 | Marzaki | H10D 1/042 |
| | | | | 257/301 |
| 11,695,007 | B2* | 7/2023 | Wang | H10D 1/66 |
| | | | | 327/109 |
| 11,769,764 | B2* | 9/2023 | Trester | G06F 30/34 |
| | | | | 257/369 |
| 2005/0156200 | A1* | 7/2005 | Kinoshita | H10D 84/907 |
| | | | | 257/E27.108 |
| 2008/0023792 | A1* | 1/2008 | Liu | G06F 30/392 |
| | | | | 257/532 |
| 2010/0059766 | A1* | 3/2010 | Fornara | H10B 41/30 |
| | | | | 438/467 |
| 2013/0011944 | A1* | 1/2013 | Fornara | H10B 69/00 |
| | | | | 438/467 |
| 2014/0077300 | A1* | 3/2014 | Noel | H10D 84/0188 |
| | | | | 257/351 |
| 2016/0197616 | A1* | 7/2016 | Cocchi | H03K 19/17768 |
| | | | | 326/41 |
| 2017/0243888 | A1 | 8/2017 | Shimbo | |
| 2019/0067274 | A1* | 2/2019 | Marzaki | H01L 21/283 |
| 2019/0067291 | A1* | 2/2019 | Marzaki | H10D 1/692 |
| 2019/0214341 | A1* | 7/2019 | Marzaki | H10D 84/038 |
| 2020/0202972 | A1* | 6/2020 | Denorme | H10B 20/25 |
| 2021/0005612 | A1* | 1/2021 | Marzaki | H10B 12/0385 |
| 2021/0005613 | A1* | 1/2021 | Marzaki | H10B 12/0385 |
| 2021/0057329 | A1* | 2/2021 | Marzaki | H10B 41/35 |
| 2021/0225757 | A1* | 7/2021 | Marzaki | H10D 1/043 |
| 2022/0139491 | A1* | 5/2022 | Denorme | G11C 17/16 |
| | | | | 365/174 |
| 2022/0344327 | A1* | 10/2022 | Marzaki | H10D 84/0135 |
| 2023/0088967 | A1* | 3/2023 | Marzaki | H10D 64/661 |
| | | | | 257/499 |
| 2023/0223332 | A1* | 7/2023 | Marzaki | H10D 84/811 |
| | | | | 257/301 |
| 2024/0347528 | A1* | 10/2024 | Nath | H10D 89/713 |

FOREIGN PATENT DOCUMENTS

| | | | | |
|---|---|---|---|---|
| DE | 102016121449 B4 | * | 1/2022 | G06F 30/39 |
| FR | 3070535 A1 | | 3/2019 | |
| FR | 3127328 A1 | * | 3/2023 | H01L 21/76831 |
| JP | 2005203447 A | * | 7/2005 | H01L 27/0207 |

* cited by examiner

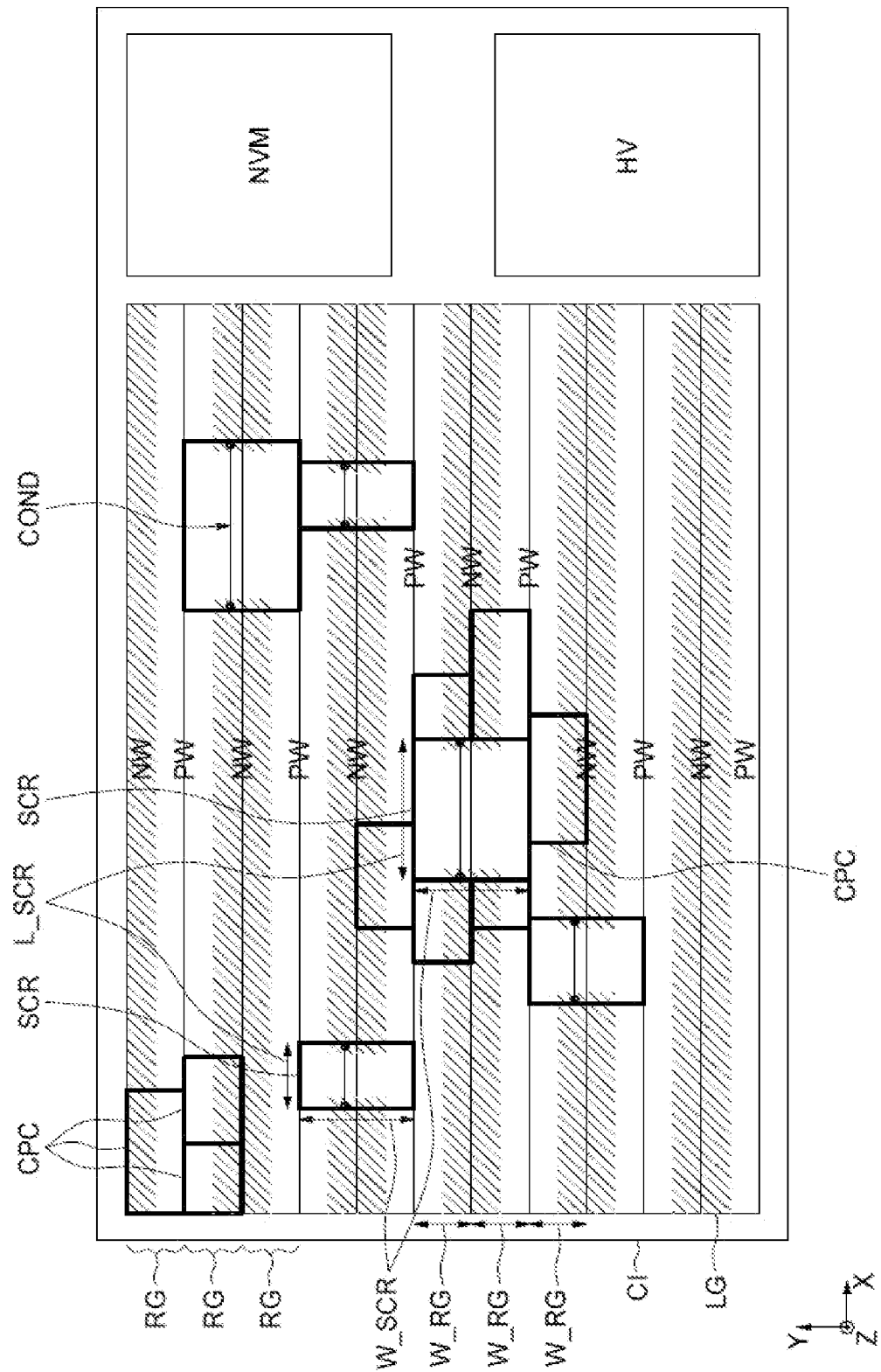

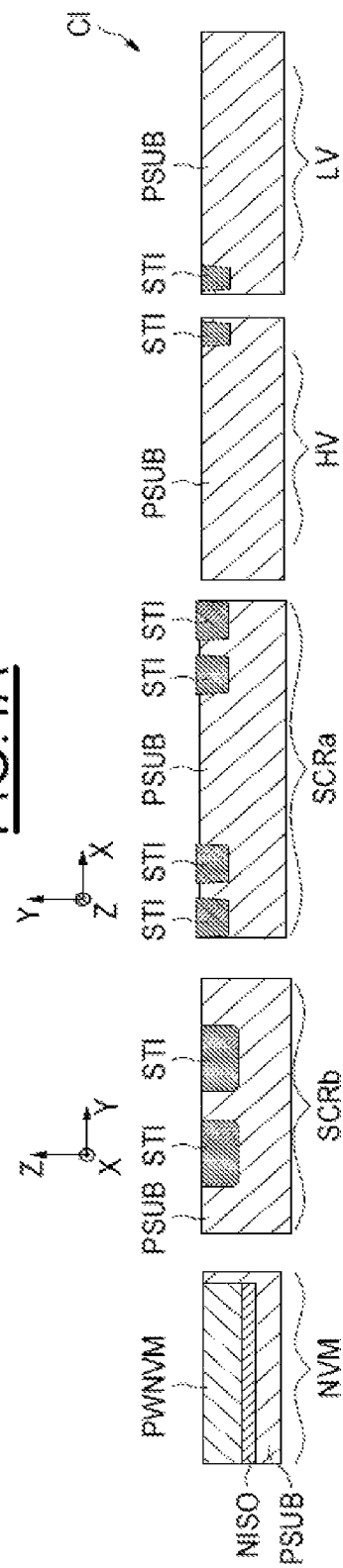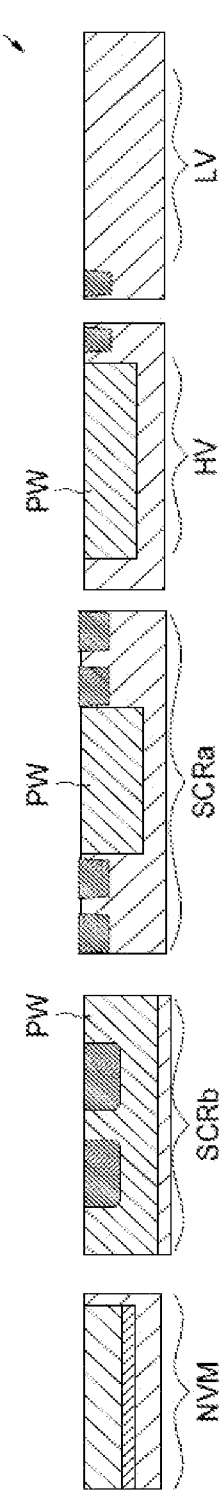

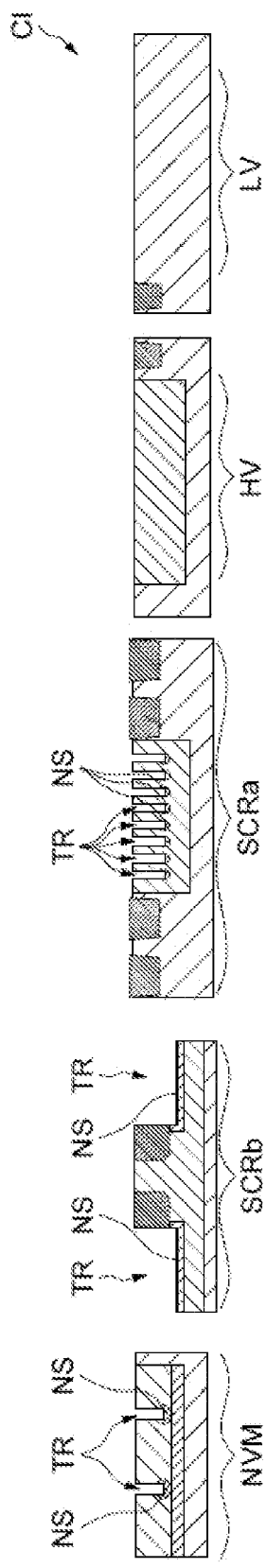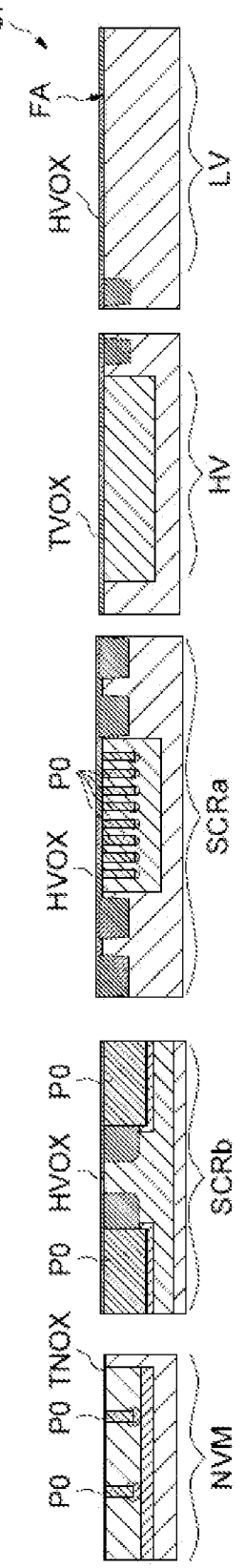

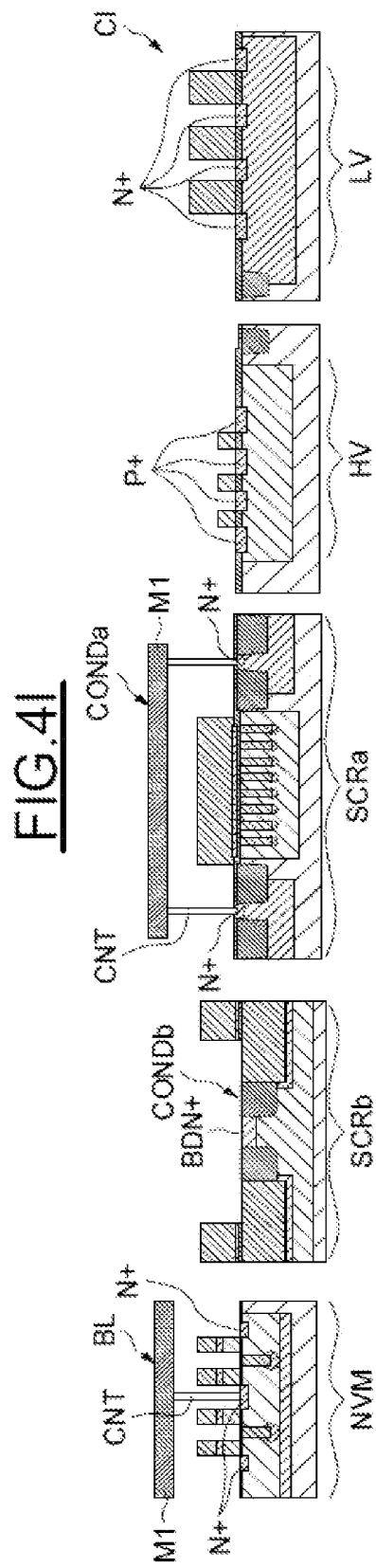

INTEGRATED CIRCUIT INCLUDING STANDARD CELLS AND AT LEAST ONE CAPACITIVE FILLING STRUCTURE

PRIORITY CLAIM

This application claims the priority benefit of French Application for Patent No. 2109789, filed on Sep. 17, 2021, the content of which is hereby incorporated by reference in its entirety to the maximum extent allowable by law.

TECHNICAL FIELD

Implementations and embodiments relate to integrated circuits and, in particular, to the logic parts of integrated circuits containing standard cells and capacitive filling structures.

BACKGROUND

Typically, the standard cells are "building blocks" of the logic parts of an integrated circuit. The standard cells are designed and characterized in advance so as to have an elementary logic function, for example such as the logic functions "NOT", "AND", "OR", "Exclusive-OR", etc., that can be combined with each other in a perfectly compatible manner in order to design a complex logic mechanism.

Physically, the combination of the standard cells is conventionally arranged in rows of the logic part, the rows having a fixed width corresponding to a width imposed on each standard cell. The various rows of the logic part can each contain a plurality of standard cells in the length, and the length of each standard cell can vary according to the elementary logic function of the cell.

The elementary logic functions are conventionally implemented using "Complementary Metal-Oxide-Semiconductor" (CMOS) technology, including in a conventional manner known per se as "NMOS" for the use of n-channel MOS transistors, in a p-type semiconductor well, and as "PMOS" for the use of p-channel MOS transistors, in an N-type semiconductor well.

Moreover, the logic parts can advantageously include capacitive structures called "filling" because they are formed in spaces that can house standard cells but are left vacant in rows of the logic part due to the nature of the design of the complex logic mechanism. The capacitive filling structures thus allow to occupy available spaces in the logic part of the integrated circuit and thus to reduce the surface footprint of a capacitive element, typically a resistive-capacitive (RC) filter capacitive element reducing the variations in the power supply voltage.

In order to even further limit the surface footprint of the capacitive element, it is advantageous to increase the capacitive value per unit of surface area of the capacitive filling structures. In this respect, implementations of capacitive elements of the "Metal-Oxide-Semiconductor" (MOS) type capacitive structure architecture in which the conductive armature includes trenches filled with a conductive material extending vertically in terms of depth in the complementary wells, and longitudinally in a direction of the surface of the logic part, have been proposed.

That being said, the capacitive value of this type of capacitive structure is limited by the composition of complementary wells of the standard cells of the CMOS type.

Indeed, on the one hand, to operate in a depletion mode, the well containing the capacitive structure, typically N-type, is polarized to a non-zero voltage, typically the power supply voltage. Thus, well taps are provided and occupy a surface that only slightly contributes to the capacitive effect.

Moreover, when this type of MOS capacitive structure is adapted to operate in a NOT mode, typically in a p-type well, the longitudinal ends of the trenches must be separated by a non-negligible distance from the neighboring well of the opposite type, typically the neighboring N-type wells, in order to avoid a flow of current via a turned-on-transistor effect. Here again, the separation distance occupies a surface that does not contribute to the capacitive effect.

SUMMARY

Implementations and embodiments defined below propose introducing a discontinuity in the arrangement of the complementary wells of the logic part at the capacitive filling structures, allowing to eliminate the aforementioned problems while increasing the capacitive value per unit of surface area. Moreover, the implementations and embodiments do not introduce a constraint on the combination possibilities and the compatibilities of the standard cells and are, in particular, compatible with no well tap technologies.

According to one aspect, in this respect an integrated circuit is proposed including a logic part comprising standard cells arranged in parallel rows along a first direction and having a fixed width covering, in a second direction perpendicular to the first direction, a half-width of a first semiconductor well with doping of a first type, for example the p type, and a half-width of a second semiconductor well with doping of a second type opposite to the first type, for example the N type, each well being shared by two adjacent rows. Among the standard cells, at least one capacitive filling structure belongs to two adjacent rows and includes a capacitive interface between a conductive armature and the first well, the extent of the second well in the first direction being interrupted over the length of the capacitive filling structure so that the first well occupies in the second direction the width of the two rows of the capacitive filling structure, the capacitive filling structure further including a conductive structure adapted to electrically connect the second well on either side of the capacitive filling structure in the first direction.

Thus, the capacitive interface formed by the conductive armature with the first well can be considerably enlarged because the first well occupies the entire width of the capacitive filling structure, via the absence of the second well. The effect of enlarging the capacitive interface is also obtained in the case in which the conductive armature does not include a trench filled with a conductive material extending vertically in terms of depth in the first well.

This further allows to eliminate the conditions of separation distance between the capacitive structure and the second well, and the need for a well tap.

Moreover, the electric continuity of the second well is ensured by the conductive structure, despite the interruption of its extent, that is to say the absence of the second well in the length of the capacitive filling structure.

According to one implementation, the conductive structure comprises at least one metal track located in a level of metal and extending in the first direction opposite the length of the capacitive filling structure, the capacitive interface extending in the second direction over the entire width of the two rows of the capacitive filling structure.

This advantageously allows to dedicate the entire extent of the width of the two rows of the capacitive filling structure, and moreover to ensure the electric continuity of the second well with a conductive structure having a resistance lower than the resistance of the second well, which can allow to reduce the quantity of well taps (typically regularly disposed in the extent of the wells).

According to one implementation, the conductive structure comprises a surface semiconductor band with strong doping of the second type located in the first well and extending in the first direction over the length of the capacitive filling structure, the capacitive interface extending in the second direction over the entire width of the two rows of the capacitive filling structure except in the width of the surface semiconductor band.

Thus, the quasi-totality, for example more than 60%, or even more than 80% of the extent of the width of the two rows is dedicated to the capacitive filling structure, and here again, the conductive structure can have a resistance lower than the resistance of the second well, allowing to reduce the quantity of well taps to be provided.

For example, said surface semiconductor band comprises metal silicide.

For example, the conductive structure includes shallow insulation trenches on either side, in the second direction, of said surface semiconductor band.

For example, said surface semiconductor band comprises doping species of the first type implanted in the first well with a density between $1 \times 10^{15}$ atoms per cubic centimeter and $1 \times 10^{16}$ atoms per cubic centimeter.

According to one implementation, said conductive armature of the capacitive filling structure comprises at least one vertical gate structure extending in terms of depth in the first well.

According to one implementation, said at least one vertical gate structure comprises a region with doping of the second type implanted at a vertical end of the vertical gate structure located in the depth of the first well, and a region with doping of the second type implanted at a vertical end of the vertical gate structure located at the surface of the first well.

The doped regions implanted at the vertical ends of the vertical gate structure can be imposed by the manufacturing of the vertical gate structures, but advantageously allow an operation in NOT mode, typically more stable in terms of variation in voltage of the capacitive value.

And, in particular, this implementation does not undergo the problem of flow of a current flow via a turned-on-transistor effect (formation of a conductive channel) between said doped regions and a neighboring well polarized to a different voltage.

According to one implementation, said conductive armature of the capacitive filling structure further comprises at least one horizontal gate structure located on the surface of the first well facing said at least one vertical gate structure.

According to one implementation, the integrated circuit further includes a non-volatile memory comprising memory cells provided with a vertical-gate buried access transistor and a floating-gate state transistor, and the vertical gate structure of said conductive armature consists of the same materials and has the same depth as the vertical gates of the buried access transistors of the memory cells.

Such an implementation of an integrated circuit advantageously allows to share the manufacturing of the non-volatile memory cells and the capacitive filling structures, in particular, that is to say in practice to manufacture the capacitive filling structures without additional cost.

According to another aspect, a method for manufacturing an integrated circuit is also proposed, comprising a manufacturing of a logic part comprising a formation of an alternation of first semiconductor wells with doping of a first type and second semiconductor wells with doping of a second type opposite to the first type, extending in parallel in terms of length in a first direction, and a formation of standard cells arranged in parallel rows along the first direction and having a fixed width covering, in a second direction perpendicular to the first direction, a half-width of one of the first wells and a half-width of one of the second wells, each well being shared by two adjacent rows. The method further comprises a formation, among the standard cells, of at least one capacitive filling structure belonging to two adjacent rows and comprising a formation of a capacitive interface between a conductive armature and the first well, the second well being formed so that its extent in the first direction is interrupted over the length of the capacitive filling structure, the first well being formed in such a way as to occupy in the second direction the width of the two rows of the capacitive filling structure, the formation of the capacitive filling structure further including a formation of a conductive structure configured to electrically connect the second well on either side of the capacitive filling structure in the first direction.

According to one embodiment, the formation of the conductive structure comprises a formation of at least one metal track located in a level of metal and extending in the first direction opposite the length of the capacitive filling structure, and the capacitive interface is formed so as to extend in the second direction over the entire width of the two rows of the capacitive filling structure.

According to one embodiment, the formation of the conductive structure comprises a formation of a surface semiconductor band with strong doping of the second type in the first well and extending in the first direction over the length of the capacitive filling structure, and the capacitive interface is formed so as to extend in the second direction over the entire width of the two rows of the capacitive filling structure, except in the width of the surface semiconductor band.

For example, the formation of said surface semiconductor band comprises a step of silicidation forming a metal silicide in the surface semiconductor band.

For example, the formation of the conductive structure includes a formation of shallow insulation trenches on either side, in the second direction, of said surface semiconductor band.

For example, the formation of said surface semiconductor band comprises an implantation of doping species of the first type in the first well with a density between $1 \times 10^{15}$ atoms per cubic centimeter and $1 \times 10^{16}$ atoms per cubic centimeter.

According to one embodiment, the formation of said conductive armature includes a formation of at least one vertical gate structure extending in terms of depth in the first well.

For example, the formation of said vertical gate structure comprises a formation of a trench etched in the first well and covered on the bottom and the sides with a dielectric envelope, an implantation of a region with doping of the second type in the first well at the bottom of the trench, a filling of the trench with a conductive material, and an implantation of a region with doping of the second type adjacent to the trench on the surface of the first well.

For example, the formation of said conductive armature of the capacitive filling structure further comprises a formation of at least one horizontal gate structure located on the surface of the first well facing said at least one vertical gate structure.

According to one embodiment, the method further includes a manufacturing of a non-volatile memory comprising memory cells provided with a vertical-gate buried access transistor and a floating-gate state transistor, and the formation of the vertical gate structure of said conductive armature is carried out simultaneously with a formation of the vertical gates of the buried access transistors of the memory cells.

BRIEF DESCRIPTION OF THE DRAWINGS

Other advantages and features will appear upon examination of the detailed description of implementations and embodiments, in no way limiting, and of the appended drawings, in which:

FIG. 1 illustrates an integrated circuit including a logic part as well as other peripheral parts;

FIGS. 4A-4I illustrate steps of a method for manufacturing the integrated circuit as described above in relation to FIG. 1.

DETAILED DESCRIPTION

FIG. 1 illustrates an example of an integrated circuit CI including a logic part LG, as well as other peripheral parts, for example a non-volatile memory part NVM and a high-voltage part HV. It will be noted that the proportions shown in FIG. 1 are not necessarily to scale.

The logic part LG includes standard cells CPC, each configured to implement an elementary logic function, for example such as "AND", "OR" logic gates, latches, etc., using CMOS technology. Thus, each standard cell CPC is formed on a first semiconductor well PW with doping of a first type, that is to say for example the type P, and on a second semiconductor well NW with doping of a second type opposite to the first type, that is to say for example the type N.

Moreover, the organization of the standard cells CPC in the logic part LG is carried out via an arrangement of the standard cells CPC in parallel rows RG along a first direction X, which defines the length of the rows RG, and having a fixed width W_RG, in a second direction Y perpendicular to the first direction X, imposed on each standard cell CPC. The length of the standard cells CPC is free and can vary according to the size of the logic circuit that composes it.

The first wells PW and the second wells NW of the logic part LG are disposed alternatingly, in parallel along the first direction X, so that each well PW, NW is shared by two adjacent rows RG. The rows thus cover in width W_RG, in the second direction Y, a half-width of a first semiconductor well PW and a half-width of a second semiconductor well NW.

Moreover, among the standard cells CPC, the logic part LG includes at least one capacitive filling structure SCR, at locations not occupied by standard cells CPC in the rows RG. Each capacitive filling structure SCR includes a capacitive interface between a conductive armature and the first well PW.

Each capacitive filling structure SCR belongs to two adjacent rows and the extent of the second well NW in the first direction X is interrupted, that is to say that the second well NW is not formed at this location, over the length of the capacitive filling structure L_SCR. As for the first well PW, it occupies, in the second direction Y, the width of the two rows RG of the capacitive filling structure W_SCR.

Consequently, as will be described below in relation to FIGS. 2A-2C and 3A-3C, the capacitive interface can be formed in such a way as to extend, in the second direction Y, over all or almost all of the width of the two rows of the capacitive filling structure W_SCR.

Moreover, in order to ensure an electric continuity in the second semiconductor wells NW, each capacitive filling structure SCR includes a conductive structure COND (illustrated schematically in FIG. 1 by a horizontal line (according to the X direction) connecting two points) electrically connecting the second well NW on either side of the capacitive filling structure SCR in the first direction X.

Figure 2A:
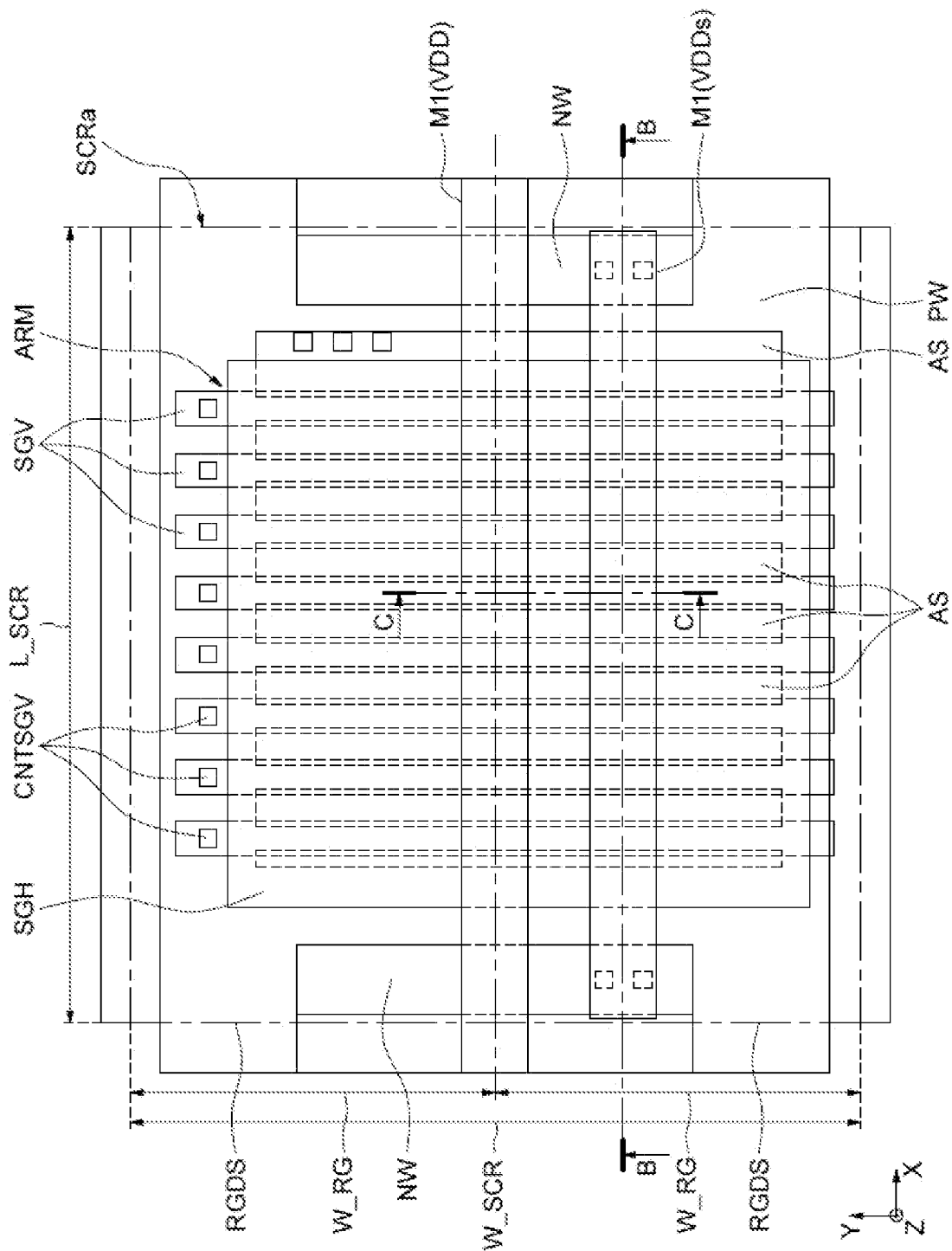
FIGS. 2A-2C illustrate an implementation of a conductive structure.
Figure 2B:
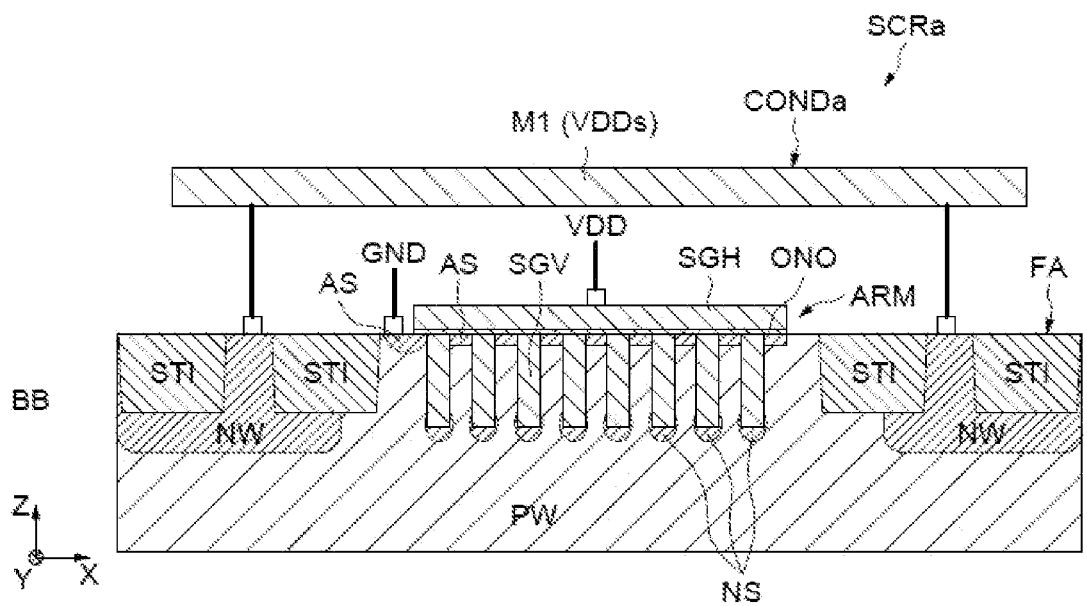
Figure 2C:
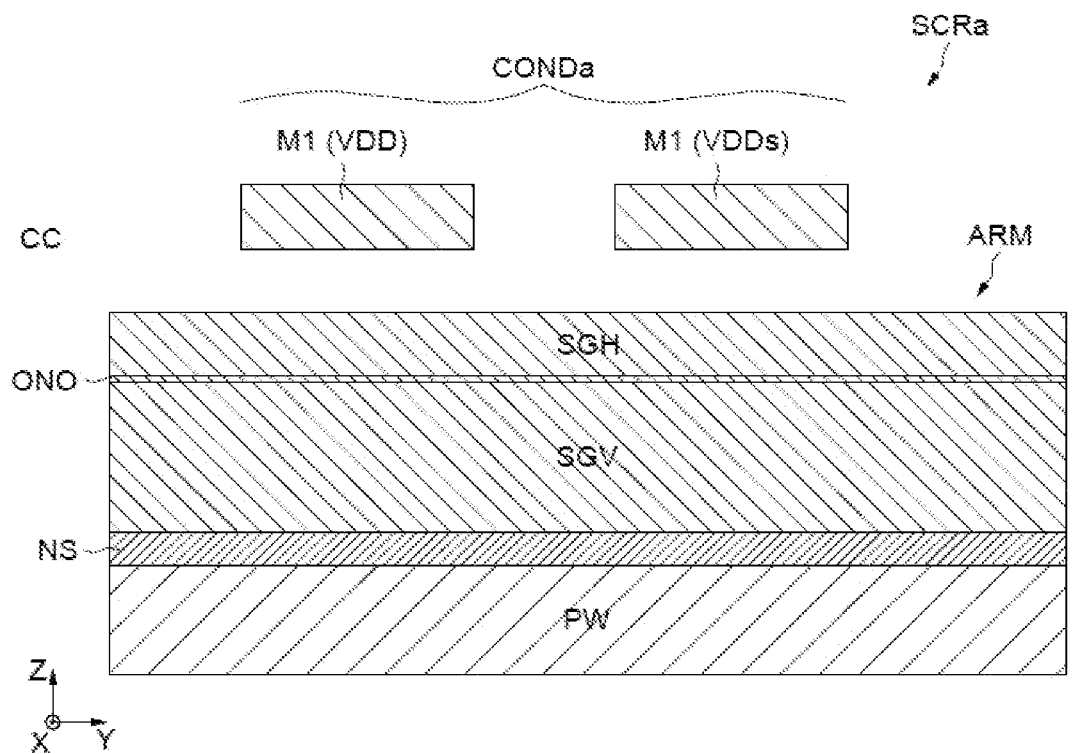
Figure 3A:
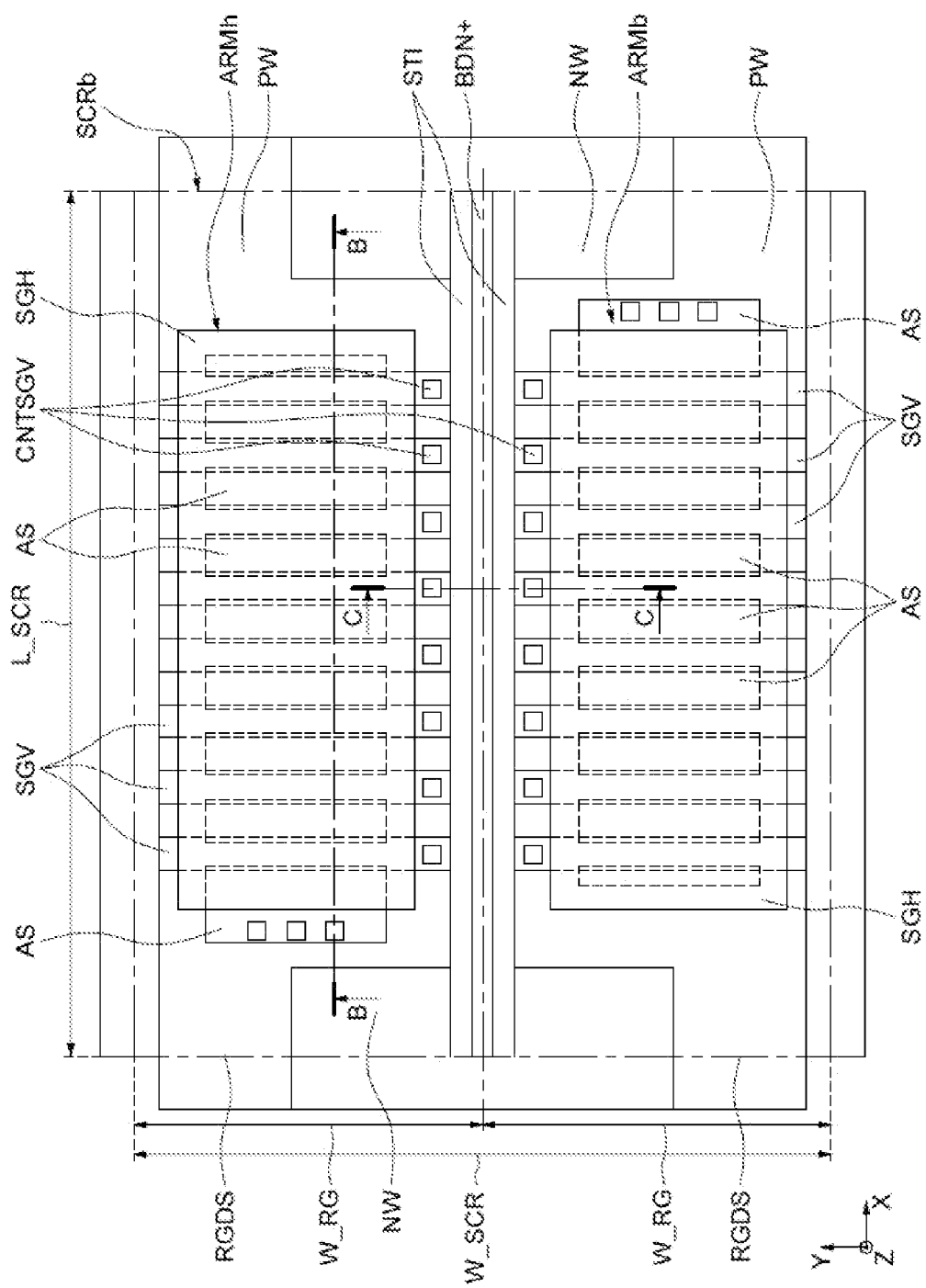
FIGS. 3A-3C illustrate another implementation of the conductive structure.
Figure 3B:
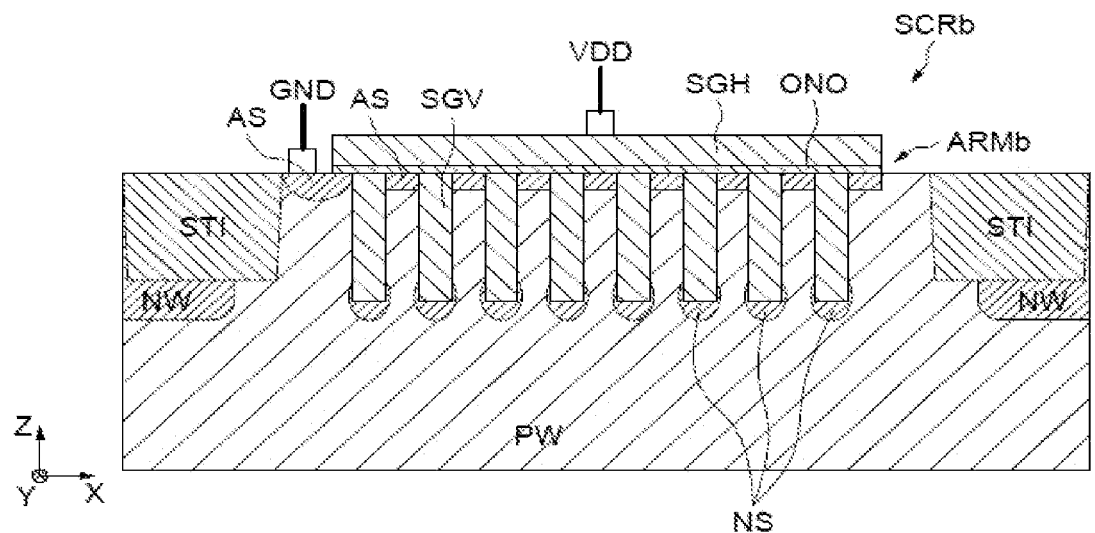
Figure 3C:
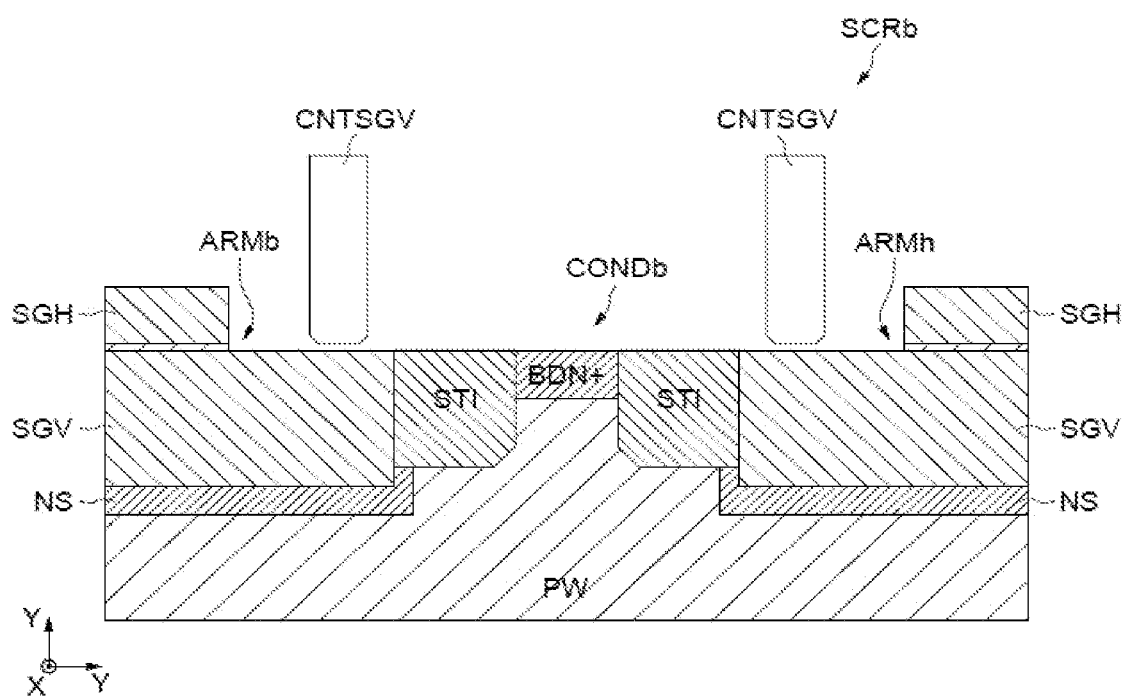

In this respect reference is made to FIGS. 2A-2C and to FIGS. 3A-3C illustrating, in particular, two implementations of the conductive structure CONDa, CONDb.

FIG. 2A shows a top view of a first example of a capacitive filling structure SCRa in a plane (X-Y), FIG. 2B shows a cross-sectional view of the capacitive filling structure SCRa in the plane BB (X-Z) of FIG. 2A, and FIG. 2C shows a cross-sectional view of the capacitive filling structure SCRa in the plane CC (Y-Z) of FIG. 2A. The directions X, Y, Z correspond to an orthogonal reference frame shared by FIGS. 2A, 2B and 2C.

In this example, the conductive structure CONDa electrically connects the second well NW on either side of the capacitive filling structure SCRa via a metal track M1, extending in the first direction X over the length of the capacitive filling structure L_SCR. The metal track M1 is located in a level of metal, for example the first level of metal, of an interconnection part usually referred to as Back End Of Line (BEOL), formed above the front face FA of the semiconductor part, usually referred to as Front End Of Line (FEOL). The front face FA conventionally designates the face of the semiconductor substrate and of the semiconductor wells PW, NW on which the semiconductor devices such as transistors and capacitive elements of the MOS type are made.

Consequently, the conductive structure CONDa does not occupy space in the first well PW in particular, and leaves completely free the entire width W_SCR of the first well PW to form therein the capacitive interface.

The conductive armature ARM forming the capacitive interface of the MOS type with the first well PW advantageously comprises at least one vertical gate structure SGV extending vertically (in the direction Z) in terms of depth in the first well PW. The vertical gate structures SGV include a conductive material, for example polycrystalline silicon, filling trenches etched in the first well PW. A dielectric envelope is provided on the sides and the bottom of the trenches so as to electrically insulate the conductive material and the first well PW.

Moreover, the vertical gate structures SGV extend in terms of length in the second direction Y and are parallel to each other along the second direction Y. The width of the vertical gate structures SGV in the first direction X is minimized, in order to multiply the number of parallel vertical gate structures SGV contained in the length L_SCR (first direction X) of the capacitive filling structure SCRa.

Furthermore, in this example, the conductive armature ARM of the capacitive filling structure SCR further comprises a horizontal gate structure SGH located on the surface of the first well PW facing said at least one vertical gate structure SGV. The horizontal gate structure SGH is electrically connected to the vertical gate structures SGV.

The capacitive interface is defined by the surface at which the conductive armature ARM and the first well PW face each other. The capacitive interface is thus in particular composed of the outer surfaces of the trenches in contact with the first well PW.

Thus, in a manner visible in FIG. 2A, the totality of the available space is occupied by the capacitive interface inside the frames RGDS each corresponding to the contour of a standard cell CPC having the length L_SCR in a respective row RG. The standard cell is, in this case, absent and replaced by the capacitive filling structure SCRa.

Indeed, the vertical gate structures SGV, and thus the capacitive interface, advantageously extend in the second direction Y over the entire length of the two rows RG of the capacitive filling structure W_SCR.

In the first direction X, a negligible space is nevertheless devoted to the formation of contact with the second well NW on either side of the length L_SCR of the capacitive filling structure SCRa in order to electrically connect there the metal track M1 of the conductive structure CONDa ensuring the electric continuity of the second well NW. This space further allows compatibility with the rules of longitudinal abutting in the first direction X between neighboring standard cells and the capacitive filling structure SCRa.

Moreover, the vertical gate structures SGV can comprise a region NS with doping of the second type (type N), implanted in the first well PW at the bottom of the trenches before they are filled with the conductive material. The vertical gate structures SGV can also comprise another region AS with doping of the second type (type N), implanted on the surface of the first well PW (at the front face FA).

These implanted regions of the second type NS, AS are present because of the method for manufacturing the vertical gate structures SGV, advantageously cointegrated with the method for manufacturing non-volatile memory cells (see below in relation to FIGS. 4A-4I). That being said, the implanted regions NS, AS offer a source of minority carriers allowing to form an inversion channel along the capacitive interface, which allows the capacitive filling structure SCR to operate in NOT mode.

Reference is now made to FIGS. 3A, 3B and 3C.

FIG. 3A shows a top view of a second example of a capacitive filling structure SCRb in a plane (X-Y), FIG. 3B shows a cross-sectional view of the capacitive filling structure SCRb in the plane BB (X-Z) of FIG. 3A, and FIG. 3C shows a cross-sectional view of the capacitive filling structure SCRb in the plane CC (Y-Z) of FIG. 3A. The directions X, Y, Z correspond to an orthogonal reference frame shared by FIGS. 3A, 3B and 3C.

In this example, the conductive structure CONDb electrically connects the second well NW on either side of the capacitive filling structure SCRb via a surface semiconductor band BDN+ with strong doping of the second type (type N, N+) located in the first well PW, and extending in the first direction X over the length of the capacitive filling structure L_SCR.

"Surface" means that the depth of implantation of the semiconductor band BDN+ is located at the surface of the first well PW, in a manner comparable to the depth of implantation of regions of transistor conduction, and not to the depth of a well such as the first well PW or the second well NW.

For example, the surface semiconductor band BDN+ with strong doping of the N type can be obtained by an implantation of doping species of the N type, typically boron for a substrate, as well as the first well PW, made of silicon, with a density of approximately $5*10^{15}$ atoms per cubic centimeter and $10^{16}$ atoms per cubic centimeter.

Advantageously, the surface semiconductor band BDN+ comprises metal silicide, allowing to lower the resistivity of the semiconductor band BDN+.

Moreover, shallow insulation trenches STI (usually Shallow Trench Insulation) are provided on either side, in the second direction Y, of the surface semiconductor band BDN+, in order to avoid a short circuit with another neighboring region including metal silicide, for example such as at contacts CNTSGV of the vertical gate structures SGV.

The conductive armature ARMh, ARMb of this example of a capacitive filling structure SCRb has the same advantageous design as the conductive armature ARM described above in relation to FIGS. 2A-2C. The same elements support the same references and are not all described in detail again.

That being said, given the presence of the conductive structure CONDb in the first well PW, along the first direction X, the conductive armature ARMh, ARMb of the capacitive filling structure SCRb is divided into two parts, an "upper" part ARMh and a "lower" part ARMb, on either side, in the second direction Y, of the conductive structure CONDb.

Thus, each of the parts ARMh, ARMb of the conductive armature can include in particular: the vertical gate structures SGV, the implanted regions NS, AS, the horizontal gate structure SGH.

The conductive structure CONDb advantageously passes through the capacitive filling structure SCRb at a median position of the width of the capacitive filling structure SCRb. Thus, the two parts ARMh, ARMb of the conductive armature can be identical or symmetrical with respect to said median or to a central point.

In other words, the capacitive interface extends in the second direction Y over the entire width of the two rows of the capacitive filling structure W_SCR except in the width of the surface semiconductor band BDN+, STI. The width of the surface semiconductor band BDN+, STI in the second direction Y occupies less than 10% of the width W_SCR of the two rows RG of the capacitive filling structure SCRb.

Thus, the quasi-totality, for example more than 60%, or even more than 80%, of the extent of the width W_SCR of the two rows RG of the capacitive filling structure SCRb is dedicated to the capacitive interface.

Reference is now made to FIGS. 4A to 4I which illustrate results of steps of a method for manufacturing the integrated circuit CI as described above in relation to FIG. 1, both in the first example SCRa described in relation to FIGS. 2A-2C and in the second example SCRb described in relation to FIGS. 3A-3C.

The manufacturing method further comprises, conjointly with the manufacturing of the capacitive filling structures SCRa, SCRb, a manufacturing of non-volatile memory cells NVM including a vertical-gate access transistor and a floating-gate state transistor, of high-voltage transistors belonging to the high-voltage part HV, and of low-voltage transistors belonging to a low-voltage part LV for example such as the logic part LG (FIG. 1).

Consequently, as will appear below, all the steps of manufacturing the capacitive filling structures SCRa, SCRb can also be provided for the manufacturing of the other devices of the integrated circuit CI. In other words, the method for manufacturing the capacitive filling structures SCRa, SCRb can be integrally cointegrated with an existing manufacturing method, and thus be implemented for free.

The various parts NVM, HV, LV, SCRa, SCRb of the integrated circuit CI are formed from the same semiconductor substrate PSUB, typically silicon with doping of the p type.

The capacitive filling structure SCRb, corresponding to the example of FIGS. 3A-3C, is shown in a plane of a pair YZ (analogously to FIG. 3C), whereas the capacitive filling structure SCRa, corresponding to the examples of FIGS. 2A-2C, is shown in a plane of a pair XZ (analogously to FIG. 2B). Of course, the manufacturing methods of the two examples mentioned above are shown simultaneously, but in practice, only one of the two examples can be carried out.

FIG. 4A illustrates the result of a step of defining the well PWNVM of the non-volatile memory cells NVM, as well as of forming the shallow insulation trenches STI.

The formation of the shallow insulation trenches STI typically comprises an etching of openings, called trenches, in the substrate PSUB and a formation of a dielectric material filling the trenches. The shallow insulation trenches STI are typically present in all the parts of the integrated circuit and allow to define the contour of the "active regions", and to ensure a lateral electric insulation between neighboring devices.

The formation of the well of the memory cells PWNVM is carried out specifically because of a specific doping relative to the writing voltages involved, and because of the implantation of a buried semiconductor layer NISO at a depth in the substrate PSUB, allowing to insulate the well PWNVM and to form a source line (or source plane) of the memory NVM.

FIG. 4B illustrates the result of a step of defining the high-voltage wells PW, with doping of the first type, that is to say the implantation of p-type dopants at a concentration adapted to the voltages involved in the high-voltage part during operation of the integrated circuit CI.

FIG. 4C illustrates the result of a step of etching of trenches TR intended to house the vertical gate structures SGV belonging to the memory cell NVM (vertical-gate buried access transistors) and to the capacitive filling structures SCRa, SCRb. The trenches TR are open in the respective wells PW and PWNVM by dry directional etching, of the plasma etching type, through the patterns of an etching mask. The depth of the trenches TR is the same in the various parts of the integrated circuit CI, and the bottom of the trenches is located at a depth substantially located at the source plane NISO, slightly above.

An envelope of gate dielectric is deposited on the sides and the bottoms of the trenches TR, for example via thermal growth of a layer of silicon oxide.

Moreover, a region NS with doping of the second type (type N) is implanted at the bottom of the trenches TR. The region NS forms a source region of the vertical-gate buried access transistor of the memory cells, in contact with the source plane NISO.

FIG. 4D illustrates the result of a step of forming the vertical gate structures SGV, comprising an excess filling of the trenches TR with a conductive material, for example polycrystalline silicon P0. The excess conductive material overflowing from the trenches TR is removed for example by a chemical mechanical polishing method.

Moreover, a layer of high-voltage oxide HVOX is deposited on the entire front face FA of the substrate PSUB, then thinned in the non-volatile memory NVM part to a thickness called tunnel thickness TNOX.

Figure 4E:
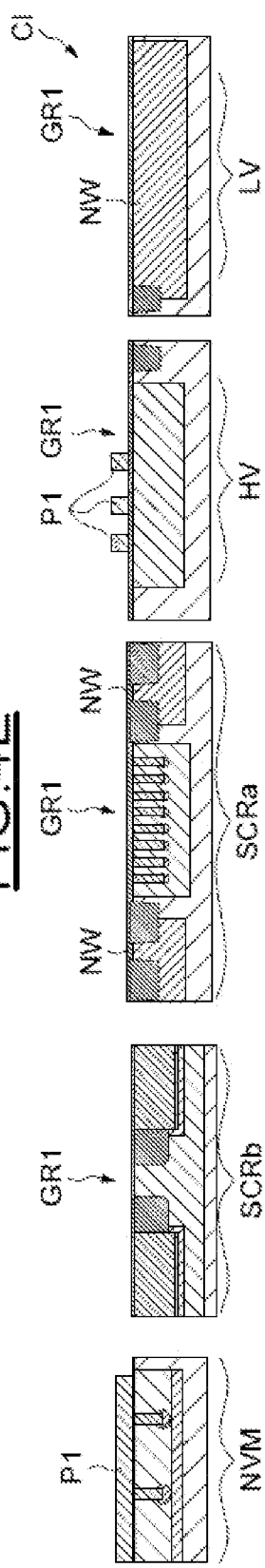

FIG. 4E illustrates the result of a step of forming a first gate conductive layer P1, typically made of polycrystalline silicon, on the layers of high-voltage HVOX and tunnel TNOX oxide, as well as of an etching step GR1, typically dry etching in the pattern of a mask, allowing to define regions of gates of the high-voltage transistors HV, and to remove the first gate conductive layer P1 in the regions SCRa, SCRb and LV of the integrated circuit CI.

Figure 4F:
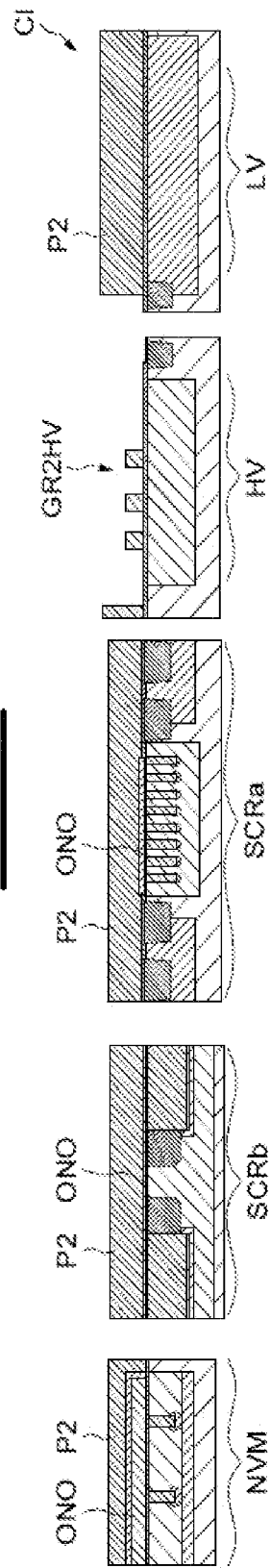

FIG. 4F illustrates the result of a step of forming a dielectric layer ONO comprising, for example, a stack of layers of oxide, of nitride and of silicon oxide, in the non-volatile memory NVM part and capacitive filling structures SCRa, SCRb.

Then, wells NW with doping of the second type, that is to say the type N, are implanted in the parts of the integrated circuit containing N-type wells, in particular, the second wells NW of the logic part LG (FIG. 1) LV, and thus capacitive filling structures SCRa, SCRb, are defined in this step.

A second gate conductive layer P2, typically made of polycrystalline silicon, is formed over the entire surface of the integrated circuit CI. In a first etching GR2HV, the second gate conductive layer P2 is removed in the high-voltage part HV.

Figure 4G:
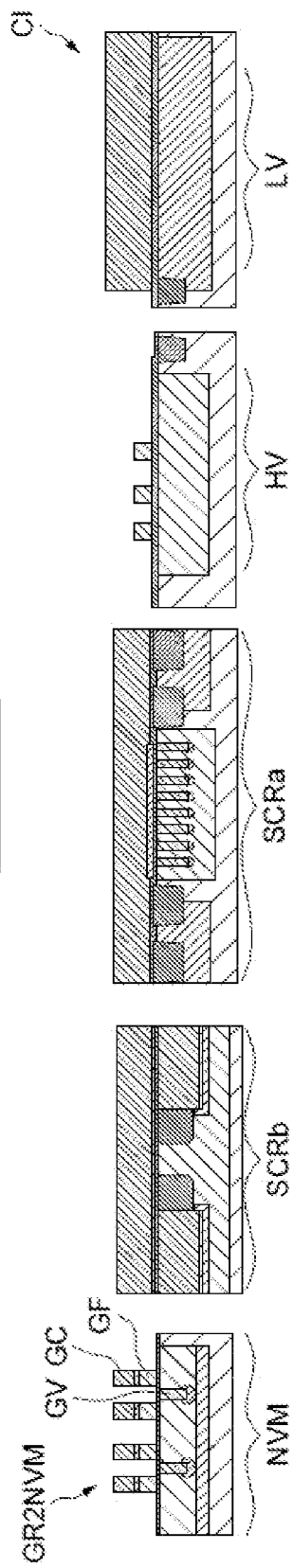

FIG. 4G illustrates the result of a second etching GR2NVM, in the non-volatile memory NVM region and through the second gate conductive layer P2, the dielectric stack ONO, and the first gate conductive layer P1, defining floating-gate GF and control gate GC regions of the floating-gate state transistors.

Figure 4H:
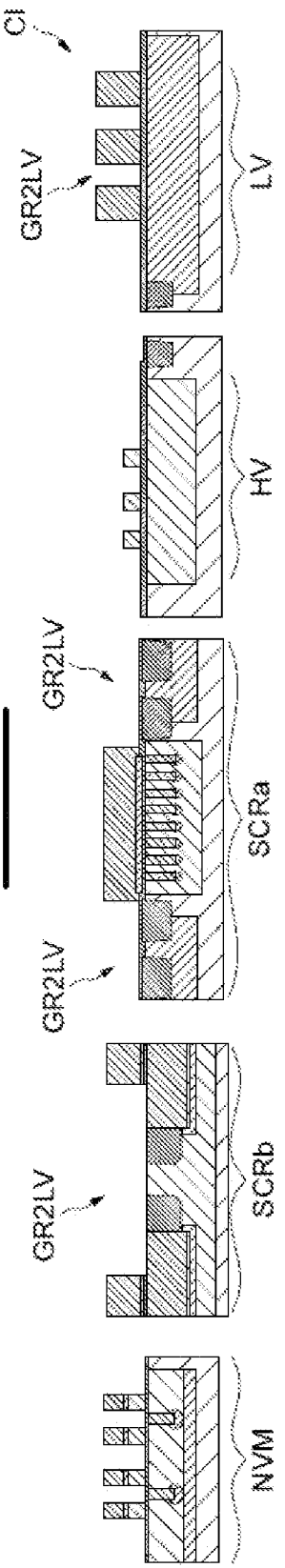

FIG. 4H illustrates the result of a third etching GR2LV of the second gate conductive layer P2, defining regions of gates of low-voltage transistors LV, as well as horizontal gate structures SGH of the capacitive filling structures SCRa, SCRb.

FIG. 4I illustrates the result of a step of implantation of a region of strongly doped conductions N+, P+ on either side of the regions of gates defined above of the high-voltage HV, low-voltage LV transistors and of the floating-gate state transistors.

Moreover, this implantation step allows to form n+ contacts with the second well NW in the capacitive filling structure SCRa, to electrically connect there, via metal contact pillars CNT, the metal track M1 belonging to the conductive structure CONDa, as well as, in the capacitive filling structure SCRb, the surface semiconductor band BDN+ with strong doping of the second type N+ belonging to the conductive structure CONDb.

Before the formation of the metal contact pillars CNT and of the first level of metal, a method for silicidation is carried out in all the parts of the integrated circuit CI, allowing to form a compound of metal silicide on the surface of all the exposed parts made of silicon, in particular the surface semiconductor band BDN+, but also the regions of transistor conduction, the well taps, and the gates of transistors made of polycrystalline silicon. The metal silicide allows to improve the conductivity of the regions made of silicon, and in particular to form ohmic contacts there.

The invention claimed is:
1. An integrated circuit, comprising:
   a logic part including standard cells arranged in parallel rows along a first direction and having a fixed width covering, in a second direction perpendicular to the first direction, a half-width of a first semiconductor well with doping of a first type and a half-width of a second semiconductor well with doping of a second type opposite to the first type;
   wherein each semiconductor well of the first and second semiconductor wells is shared by two adjacent rows; and a capacitive filling structure located among the standard cells and belonging to two adjacent rows and including a capacitive interface between a conductive armature and the first semiconductor well;

wherein an extent of the second semiconductor well in the first direction is interrupted over a length of the capacitive filling structure so that the first semiconductor well occupies in the second direction a width of the two adjacent rows of the capacitive filling structure; and wherein the capacitive filling structure further includes a conductive structure configured to electrically connect in the first direction the second semiconductor well on opposite sides of the capacitive filling structure.

2. The integrated circuit according to claim 1, wherein the conductive structure comprises at least one metal track located in a level of metal interconnect and extending in the first direction opposite the length of the capacitive filling structure, the capacitive interface extending in the second direction over an entire width of the two adjacent rows of the capacitive filling structure.

3. The integrated circuit according to claim 1, wherein the conductive structure comprises a surface semiconductor band with strong doping of the second type located in the first semiconductor well and extending in the first direction over the length of the capacitive filling structure, the capacitive interface extending in the second direction over an entire width of the two adjacent rows of the capacitive filling structure except in a width of the surface semiconductor band.

4. The integrated circuit according to claim 3, wherein said surface semiconductor band comprises metal silicide.

5. The integrated circuit according to claim 3, wherein the conductive structure includes shallow insulation trenches on either side of said surface semiconductor band extending in the second direction.

6. The integrated circuit according to claim 3, wherein said surface semiconductor band comprises doping species of the first type implanted in the first semiconductor well with a density of between $10^{15}$ atoms per cubic centimeter and $10^{16}$ atoms per cubic centimeter.

7. The integrated circuit according to claim 1, wherein said conductive armature of the capacitive filling structure comprises at least one vertical gate structure extending in terms of depth in the first semiconductor well.

8. The integrated circuit according to claim 7, wherein said at least one vertical gate structure comprises a region with doping of the second type implanted at a first vertical end of the vertical gate structure located in the depth of the first semiconductor well, and a region with doping of the second type implanted at a second vertical end of the vertical gate structure located at the surface of the first semiconductor well.

9. The integrated circuit according to claim 7, wherein said conductive armature of the capacitive filling structure further comprises at least one horizontal gate structure located on the surface of the first semiconductor well facing said at least one vertical gate structure.

10. The integrated circuit according to claim 7, further including a non-volatile memory comprising memory cells provided with a vertical-gate buried access transistor and a floating-gate state transistor, wherein the vertical gate structure of said conductive armature consists of the same materials and has the same depth as a vertical gate of the vertical-gate buried access transistor.

11. A method for manufacturing an integrated circuit, comprising:

manufacturing a logic part comprising:

forming an alternation of first semiconductor wells with doping of a first type and second semiconductor wells with doping of a second type opposite to the first type, extending in parallel in terms of length in a first direction;

forming standard cells arranged in parallel rows along the first direction and having a fixed width covering, in a second direction perpendicular to the first direction, a half-width of one of the first semiconductor wells and a half-width of one of the second semiconductor wells;

wherein each semiconductor well of said first and second semiconductor wells is shared by two adjacent rows;

forming, among the standard cells, a capacitive filling structure belonging to two adjacent rows by:

interrupting an extent of the second semiconductor well in the first direction over a length of the capacitive filling structure so that the first semiconductor well occupies, in the second direction, a width of the two adjacent rows of the capacitive filling structure;

forming a capacitive interface between a conductive armature and the first semiconductor well; and forming a conductive structure configured to electrically connect in the first direction the second semiconductor well on opposite sides of the capacitive filling structure.

12. The method according to claim 11, wherein forming the conductive structure comprises forming at least one metal track located in a level of metal interconnect and extending in the first direction facing the length of the capacitive filling structure, and wherein the capacitive interface extends in the second direction over an entire width of the two adjacent rows of the capacitive filling structure.

13. The method according to claim 11, wherein forming the conductive structure comprises forming a surface semiconductor band with strong doping of the second type in the first semiconductor well and extending in the first direction over the length of the capacitive filling structure, and wherein the capacitive interface extends in the second direction over an entire width of the two adjacent rows of the capacitive filling structure except in a width of the surface semiconductor band.

14. The method according to claim 13, wherein forming the conductive structure further comprises a silicidation forming metal silicide in the surface semiconductor band.

15. The method according to claim 13, wherein the formation of the conductive structure further comprises forming shallow insulation trenches on either side of said surface semiconductor band extending in the second direction.

16. The method according to claim 13, wherein forming said surface semiconductor band comprises implanting doping species of the first type in the first semiconductor well with a density between $10^{15}$ atoms per cubic centimeter and $10^{16}$ atoms per cubic centimeter.

17. The method according to claim 11, wherein forming said conductive armature comprises forming at least one vertical gate structure extending in terms of depth in the first semiconductor well.

18. The method according to claim 17, wherein forming said vertical gate structure comprises:
- forming a trench etched in the first semiconductor well and covered on bottom and sides with a dielectric envelope;
- implanting a region with doping of the second type in the first semiconductor well at the bottom of the trench;
- filling the trench with a conductive material; and
- implanting of a region with doping of the second type adjacent to the trench on the surface of the first semiconductor well.

19. The method according to claim 17, wherein forming said conductive armature of the capacitive filling structure further comprises forming a horizontal gate structure located on the surface of the first semiconductor well facing said at least one vertical gate structure.

20. The method according to claim 17, further including:
- manufacturing a non-volatile memory comprising memory cells provided with a vertical-gate buried access transistor and a floating-gate state transistor;
- wherein forming the vertical gate structure of said conductive armature is carried out simultaneously with forming a vertical gate of the vertical-gate buried access transistor.

* * * * *